(12) United States Patent
Matsumoto et al.

(10) Patent No.: US 12,348,237 B2
(45) Date of Patent: Jul. 1, 2025

(54) ATOMIC OSCILLATOR

(71) Applicant: NEC Corporation, Tokyo (JP)

(72) Inventors: Kenta Matsumoto, Tokyo (JP);
Takahiro Fujisaku, Tokyo (JP)

(73) Assignee: NEC CORPORATION, Tokyo (JP)

(*) Notice: Subject to any disclaimer, the term of this patent is extended or adjusted under 35 U.S.C. 154(b) by 8 days.

(21) Appl. No.: 18/378,401

(22) Filed: Oct. 10, 2023

(65) Prior Publication Data

US 2024/0137030 A1  Apr. 25, 2024
US 2024/0235563 A9  Jul. 11, 2024

(30) Foreign Application Priority Data

Oct. 20, 2022  (JP) ................. 2022-168348

(51) Int. Cl.
*H03L 7/26* (2006.01)
*G04F 5/14* (2006.01)

(52) U.S. Cl.
CPC ............... *H03L 7/26* (2013.01); *G04F 5/145* (2013.01)

(58) Field of Classification Search
CPC ............ H03L 7/26; G04F 5/145; H03B 17/00
See application file for complete search history.

(56) References Cited

U.S. PATENT DOCUMENTS

2013/0147565 A1* 6/2013 Aoyama ............... H03B 17/00
                                                    331/94.1
2016/0094233 A1* 3/2016 Nishida .................... H03L 7/26
                                                    331/94.1
2019/0386668 A1* 12/2019 Tanaka ..................... H03L 7/26

FOREIGN PATENT DOCUMENTS

JP         2013-123091 A    6/2013
JP         2020065148 A  *  4/2020

* cited by examiner

*Primary Examiner* — Ryan Johnson
(74) *Attorney, Agent, or Firm* — Sughrue Mion, PLLC

(57) ABSTRACT

An atomic oscillator of the present disclosure includes: a gas cell in which an alkali metal atom is encapsulated; a light generating unit emitting emission light onto the gas cell; a light detecting unit detecting transmitted light passed through the gas cell; and a control device determining a resonance frequency of the emission light based on a light amount of the detected transmitted light. The control device stores correspondence information in which a feature value of a transmitted light spectrum is associated with a state of the emission light, performs estimation processing to extract the feature value of the transmitted light spectrum from the detected transmitted light and estimate the state of the emission light corresponding to the extracted feature value of the transmitted light spectrum based on the correspondence information, and controls an emission state of the emission light based on the estimated state of the emission light.

9 Claims, 14 Drawing Sheets

ATOMIC OSCILLATOR

INCORPORATION BY REFERENCE

This application is based upon and claims the benefit of priority from Japanese patent application No. 2022-168348, filed on Oct. 20, 2022, the disclosure of which is incorporated herein in its entirety by reference.

TECHNICAL FIELD

The present disclosure relates to an atomic oscillator.

BACKGROUND ART

As an oscillator with long-term high-precision oscillation characteristics, an atomic oscillator that oscillates based on the energy transition of an atom of an alkali metal is known. In an atomic oscillator, the resonance frequency is determined by detection of the transmitted light amount of a light emitted onto an atom, and the oscillation frequency is controlled based on the resonance frequency.

In the abovementioned atomic oscillator, a change in the temperature inside the oscillator, a change in the magnetic field, and a change in the characteristics of light emitted onto the atom cause variations in the optical transition characteristics of the atom, resulting in reduced stability of the oscillation frequency. For such a problem, Patent Literature 1 discloses a frequency correction technique to reduce variations in the oscillation frequency due to variations in the amount of light emitted onto the atom.

Patent Literature 1: Japanese Unexamined Patent Application Publication No. JP-A 2013-123091

However, the frequency correction method disclosed in Patent Literature 1 described above causes a problem that the oscillation frequency is not stable. The reason for this is as follows.

Patent Literature 1 discloses a technique of, in a case where there is a correlation between the strength of a detection signal having a shape protruding above and the linewidth, correcting frequency shift that occurs with a variation in the linewidth based on the strength of the detection signal. The technique disclosed by Patent Literature 1 also makes it possible to, in a case where the detection signal is asymmetric, correct frequency shift resulting from a change in the strength of the detection signal. However, the technique disclosed by Patent Literature 1 does not consider a case where the asymmetry of the detection signal changes over time. For example, in a case where the asymmetry of the detection signal changes due to the wavelength variations of the light emitted onto the atom, the correlation between the strength of the detection signal and the magnitude of frequency shift is different from the case where frequency shift occurs with a variation in the linewidth, so that it is difficult to properly correct. As a result, there arises a problem that the oscillation frequency is not stable when the state of the light varies.

SUMMARY OF THE INVENTION

Accordingly, an object of the present disclosure is to provide an atomic oscillator which can solve the problem that the oscillation frequency is not stable when the state of the light varies.

An atomic oscillator as an aspect of the present invention includes: a gas cell in which an alkali metal atom is encapsulated; a light generating unit that emits emission light having at least two different frequency components onto the gas cell; a light detecting unit that detects transmitted light passed through the gas cell; and a control device that determines a resonance frequency of the emission light based on a light amount of the detected transmitted light and controls an oscillation frequency. The control device stores correspondence information in which a preset feature value of a transmitted light spectrum associating a difference frequency of the emission light with a light amount of the transmitted light is associated with a state of the emission light, performs estimation processing to extract the feature value of the transmitted light spectrum from the detected transmitted light and estimate the state of the emission light corresponding to the extracted feature value of the transmitted light spectrum based on the correspondence information, and controls an emission state of the emission light based on the estimated state of the emission light.

Further, a control method as an aspect of the present disclosure is a control method by a control device in an atomic oscillator. The atomic oscillator includes: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency. The control method includes: by the control device, storing correspondence information in which a preset feature value of a transmitted light spectrum associating a difference frequency of the emission light with a light amount of the transmitted light is associated with a state of the emission light; and by the control device, performing estimation processing to extract the feature value of the transmitted light spectrum from the detected transmitted light and estimate the state of the emission light corresponding to the extracted feature value of the transmitted light spectrum based on the correspondence information, and controlling an emission state of the emission light based on the estimated state of the emission light.

Further, a control device as an aspect of the present invention is a control device in an atomic oscillator. The atomic oscillator includes: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency. The control device includes: at least one memory configured to store instructions; and at least one processor configured to execute the instructions to store correspondence information in which a preset feature value of a transmitted light spectrum associating a difference frequency of the emission light with a light amount of the transmitted light is associated with a state of the emission light, perform estimation processing to extract the feature value of the transmitted light spectrum from the detected transmitted light and estimate the state of the emission light corresponding to the extracted feature value of the transmitted light spectrum based on the correspondence information, and control an emission state of the emission light based on the estimated state of the emission light.

Further, a computer program as an aspect of the present invention is a computer program for a control device in an atomic oscillator. The atomic oscillator includes: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency. The computer program includes instructions for causing the control device to execute processes to: store correspondence information in which a preset feature value of a transmitted light spectrum associating a difference frequency of the emission light with a light amount of the transmitted light is associated with a state of the emission light; and perform estimation processing to extract the feature value of the transmitted light spectrum from the detected transmitted light and estimate the state of the emission light corresponding to the extracted feature value of the transmitted light spectrum based on the correspondence information, and control an emission state of the emission light based on the estimated state of the emission light.

With the configurations as described above, the present disclosure can increase the stability of the oscillation frequency even when the state of the light emitted onto the atom changes.

EXAMPLE EMBODIMENT

First Example Embodiment

A first example embodiment of the present disclosure will be described with reference to FIGS. 1 to 11. First, the overview of the example embodiment according to the present disclosure will be described with reference to FIGS. 1 to 9.

Overview of First Example Embodiment

Figure 1:
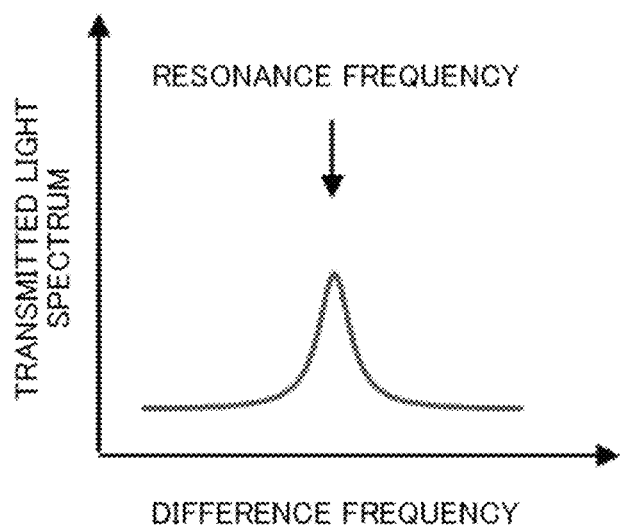
FIG. 1 is a view showing a CPT resonance appearing in a transmitted light spectrum.
Figure 2:
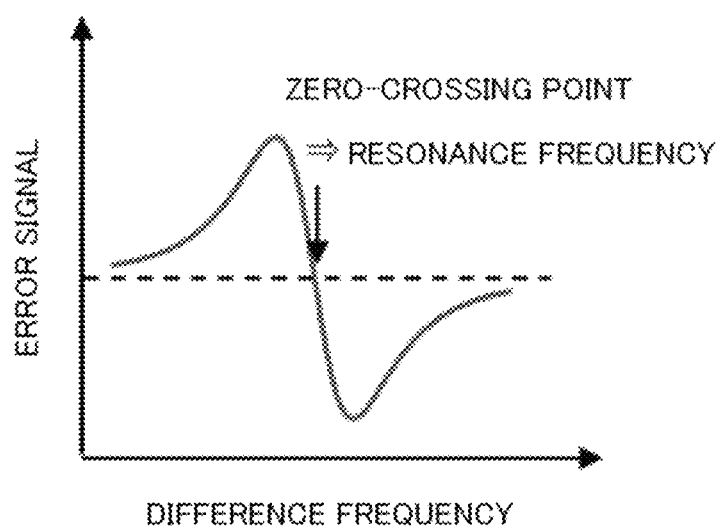
FIG. 2 is a view showing an error signal of a transmitted light spectrum.

An atomic oscillator is a device that realizes stable frequency oscillation using an atomic gas of alkali metal atoms or the like. An atomic oscillator has a gas cell in which an atomic gas is encapsulated. Then, by emitting light containing at least two different frequencies onto the gas cell and measuring transmitted light, the atomic oscillator can detect a quantum interference effect (called CPT (Coherent Population Trapping) resonance) that occurs when the transition frequency between specific quantum states of an atomic gas coincides with the difference frequency of the emitted light, as a variation in the amount of transmitted light. FIG. 1 is a view of a CPT resonance appearing in a transmitted light spectrum. For example, in the case of measuring a transmitted light spectrum when light transmitted through a cesium atom is detected while sweeping the difference frequency of the emitted light, when the difference frequency coincides with a transition frequency between specific quantum states, the amount of transmitted light reaches it's the peak value as shown in FIG. 1 and a CPT resonance is detected. The difference frequency of the emitted light at this time is called a resonance frequency. By detecting the resonance frequency of the CPT resonance and controlling the difference frequency of the emitted light to coincide with the transition frequency between specific quantum states, a high-precision atomic oscillator using the quantum interference effect is realized. In the atomic oscillator using CPT resonance described above, the resonance frequency of the CPT resonance is used as the reference for the oscillation frequency.

In general, a transmitted light spectrum is expressed as a Lorentzian function centered on the transition frequency between quantum states, and a point where the transmitted light amount has a local maximum is regarded as the resonance frequency of CPT resonance and used as the reference for the oscillation frequency. As an example, by sweeping the difference frequency of the emitted light when the atomic oscillator is started, it is possible to acquire an error signal of the transmitted light spectrum as shown in a schematic view shown in FIG. 2, and consider the zero-crossing point of the error signal as the resonance frequency and use as the reference for the oscillation frequency. The error signal of the transmitted light spectrum can be acquired by, for example, when sweeping the difference frequency of the emitted light, modulating the difference frequency at a reference frequency with a period shorter than the sweep period of the difference frequency, and performing lock-in detection of the detected transmitted light amount at the reference frequency.

Figure 3:
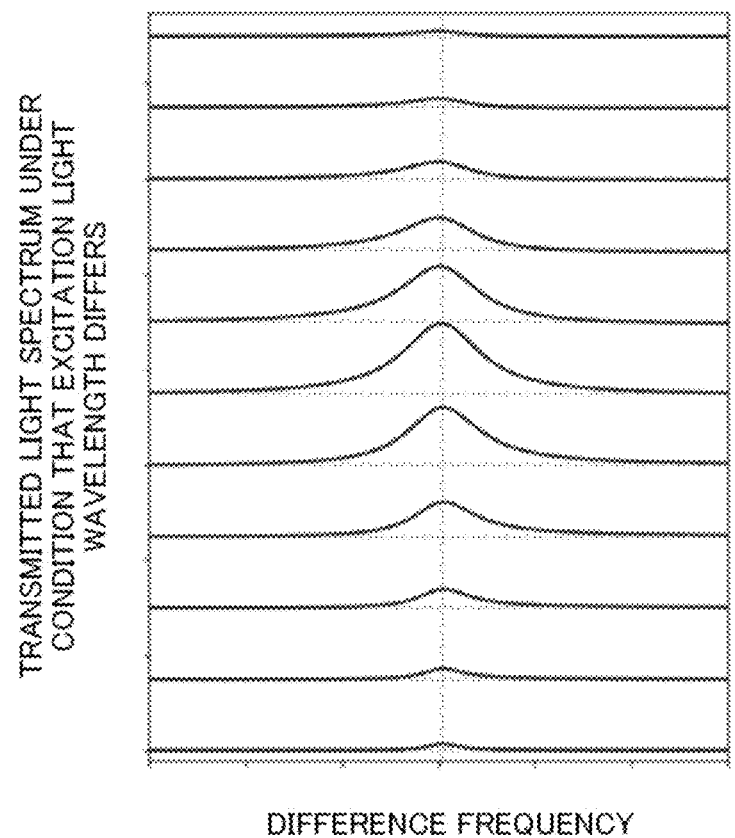
FIG. 3 is a view showing a transmitted light spectrum when the wavelength of light to be emitted varies.
Figure 4:
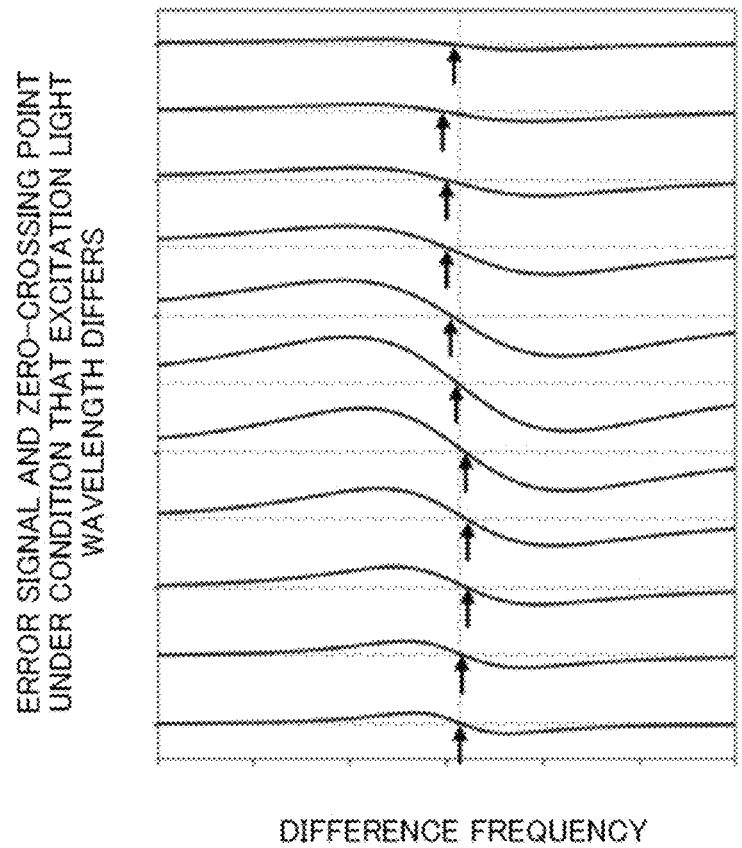
FIG. 4 is a view showing an error signal of the transmitted light spectrum when the wavelength of light to be emitted varies.
Figure 5:
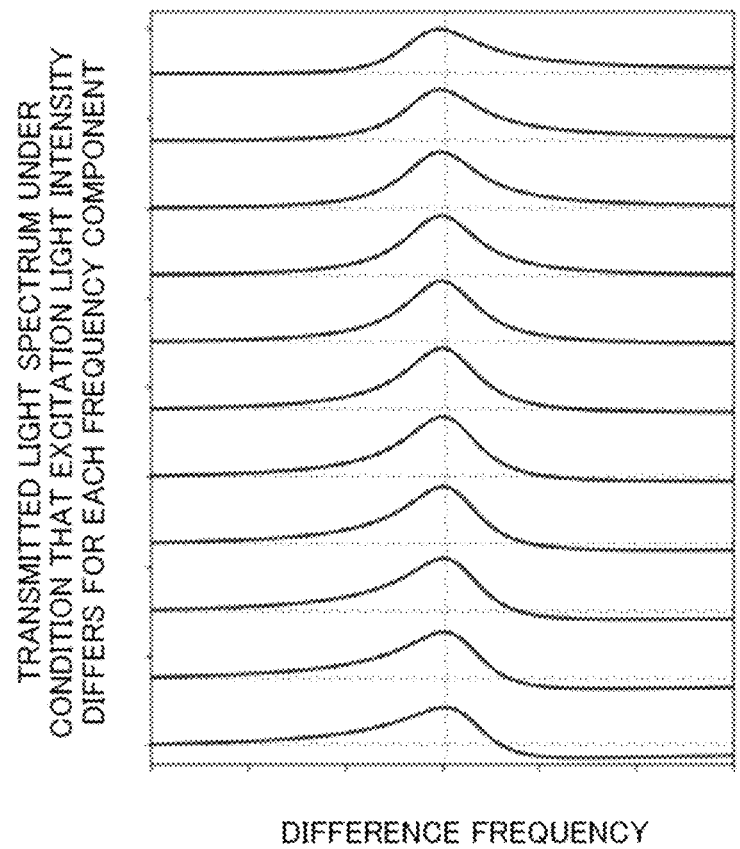
FIG. 5 is a view showing a transmitted light spectrum when the intensity of light to be emitted varies for each frequency component.
Figure 6:
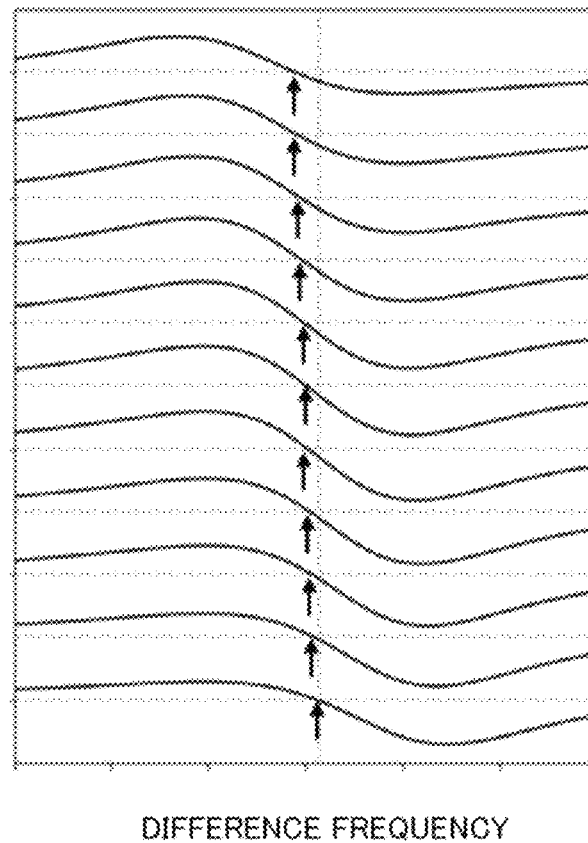
FIG. 6 is a view showing an error signal of the transmitted light spectrum when the intensity of light to be emitted varies for each frequency component.

Depending on the state of the emitted light, it may occur that the shape of the transmitted light spectrum is no longer a Lorentzian function centered on the transition frequency between quantum states. That is to say, in a case where there is an unintentional change in the state of the emitted light, a change in the oscillation frequency may occur as illustrated below. As an example, in a case where the wavelength of the emitted light is different from the transition wavelength determined from the energy difference between the quantum states of the atomic gas, the shape of the transmitted light spectrum may be asymmetric. At this time, variations in the wavelength of the emitted light can occur, for example, due to variations in the temperature of the light source. FIGS. 3 and 4 show schematic views of a transmitted light spectrum and a change in the error signal of the transmitted light spectrum when the wavelength of the emitted light varies. In a case where the resonance frequency is determined based on the zero-crossing point of the error signal shown in FIG. 4, when the wavelength of the emitted light is greatly detuned from the excited state, the resonance frequency deviates from the transition frequency between specific quantum states of alkali metal atoms, and the oscillation frequency cannot be precisely controlled. Moreover, for example, in a case where the intensity of the emitted light differs for each frequency component, the shape of the transmitted light spectrum may be asymmetric. FIGS. 5 and 6 show schematic views of a transmitted light spectrum and a change in the error signal of the transmitted light spectrum when the intensity of the emitted light varies for each frequency component. In a case where the resonance frequency is determined based on the zero-crossing point of the error signal shown in FIG. 6, when the intensity of the emitted light varies for each frequency component, the resonance frequency deviates from the transition frequency between specific quantum states of alkali metal atoms, and the oscillation frequency cannot be precisely controlled. For this reason, in order to ensure the stability of the oscillation frequency of the atomic oscillator, it is desirable to have a mechanism for correcting a frequency shift accompanying a variation in the state of light emitted onto the atomic gas. The variation in the state of the light emitted onto the atomic gas as described above may occur due to a sudden change in the environment such as temperature and magnetic field around the atomic oscillator.

The technique according to this example embodiment has been made in view of the problem of decrease of the frequency stability of an atomic oscillator due to an unintentional variation in the state of light emitted onto an atomic gas as described above. That is to say, the technique according to this example embodiment makes it possible to provide an atomic oscillator including a stabilization mechanism so as to increase the frequency stability against a variation in the state of light emitted onto an atomic gas.

Figure 7:
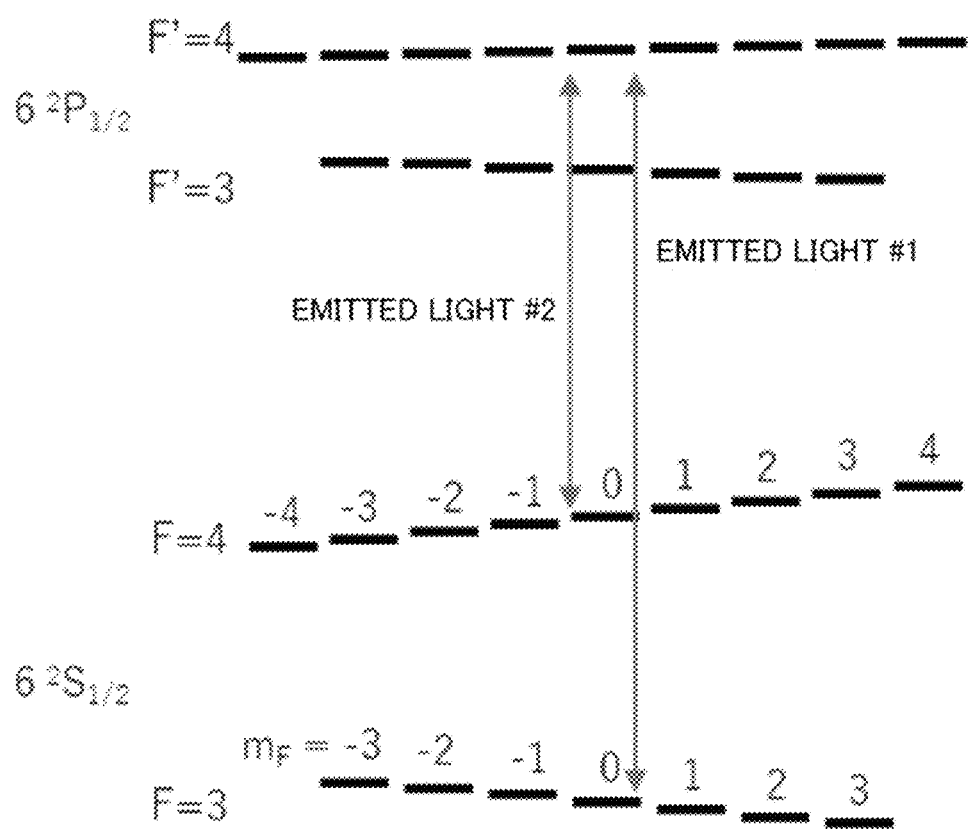
FIG. 7 is a view showing a hyperfine structure under magnetic field of a cesium atom.

A transmitted light spectrum by CPT resonance can be numerically calculated by giving the state of an emitted light and the transition process of the quantum state of an atomic gas. The transition process of the quantum state can be described by the transition probability between two states and the relaxation probability of each state. For example, considering a cesium atom as an alkali metal atom, its ultrafine structure under magnetic field has quantum states as shown in FIG. 7. FIG. 7 shows arrows corresponding to typical wavelengths of emitted light having two different frequencies. In the case of a cesium atom, there are 32 quantum states that can be involved in state transitions due to the emitted light, and a transmitted light spectrum by CPT resonance can be numerically calculated with high precision by giving all the transition processes. The shape of the transmitted light spectrum changes with the state of the emitted light, and the shape of the transmitted light spectrum can be calculated with high precision by giving the transition processes of all the quantum states that can be involved in the state transitions among the quantum states of the atomic gas.

For this reason, by previously acquiring a transmitted light spectrum by numerical calculation with respect to assumed states of the emitted light, the state of the emitted light can be estimated from a transmitted light spectrum obtained by measurement. Specifically, the state of the emitted light can be estimated by extracting a feature value of a transmitted light spectrum necessary for estimating the state of the emitted light from the measurement values of the transmitted light spectrum, and comparing the feature value extracted from the measurement values with a feature value extracted from the numerical solutions of a transmitted light spectrum. For example, in a case where an alkali metal atom, such as a cesium atom, with a large number of quantum states involved in optical transitions is used, it takes long time to perform numerical calculation. For this reason, the atomic oscillator according to this example embodiment includes a storage device, which stores a table (correspondence information) in which the state of the emitted light is associated with the feature value extracted from the transmitted light spectrum numerical solutions. Then, in the extraction of the feature value necessary for estimating the state of the emitted light, for example, a transmitted light spectrum T(f) in which a transmitted light amount T obtained by subtracting a proper offset is expressed as a function of a difference frequency f of the emitted light is approximated by a function shown in the following equation 1 to obtain parameters (symmetric component amplitude S, antisymmetric component amplitude A, line width W, resonance center X), and the set of the parameters may be a feature value.

$$T(f) = S \times \left( \frac{W^2}{(f-X)^2 + W^2} \right) + A \times \left( \frac{W(f-X)}{(f-X)^2 + W^2} \right) \quad \text{[Equation 1]}$$

By comparing the feature value obtained from the measurement values with the feature value in the table stored in the storage device with the absolute values of the above-mentioned parameters or the ratio or the like between the parameters as the feature value, the state of the emitted light at the moment of the measurement can be estimated in a short time. Moreover, the feature value necessary for estimating the state of the emitted light may be extracted from an error function of a transmitted light spectrum, for example.

Figure 8:
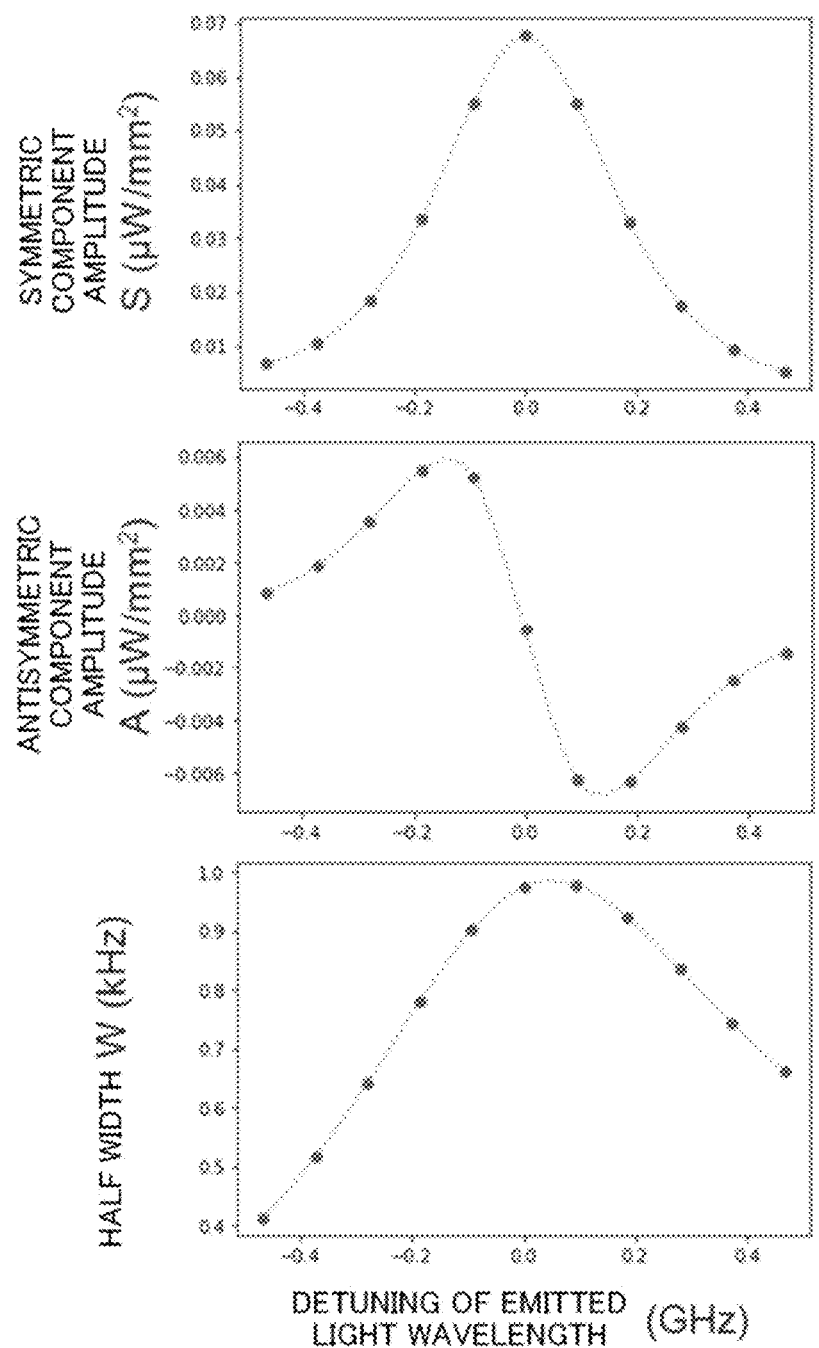
FIG. 8 is a view showing a feature value extracted from a transmitted light spectrum when the wavelength of light to be emitted varies.
Figure 9:
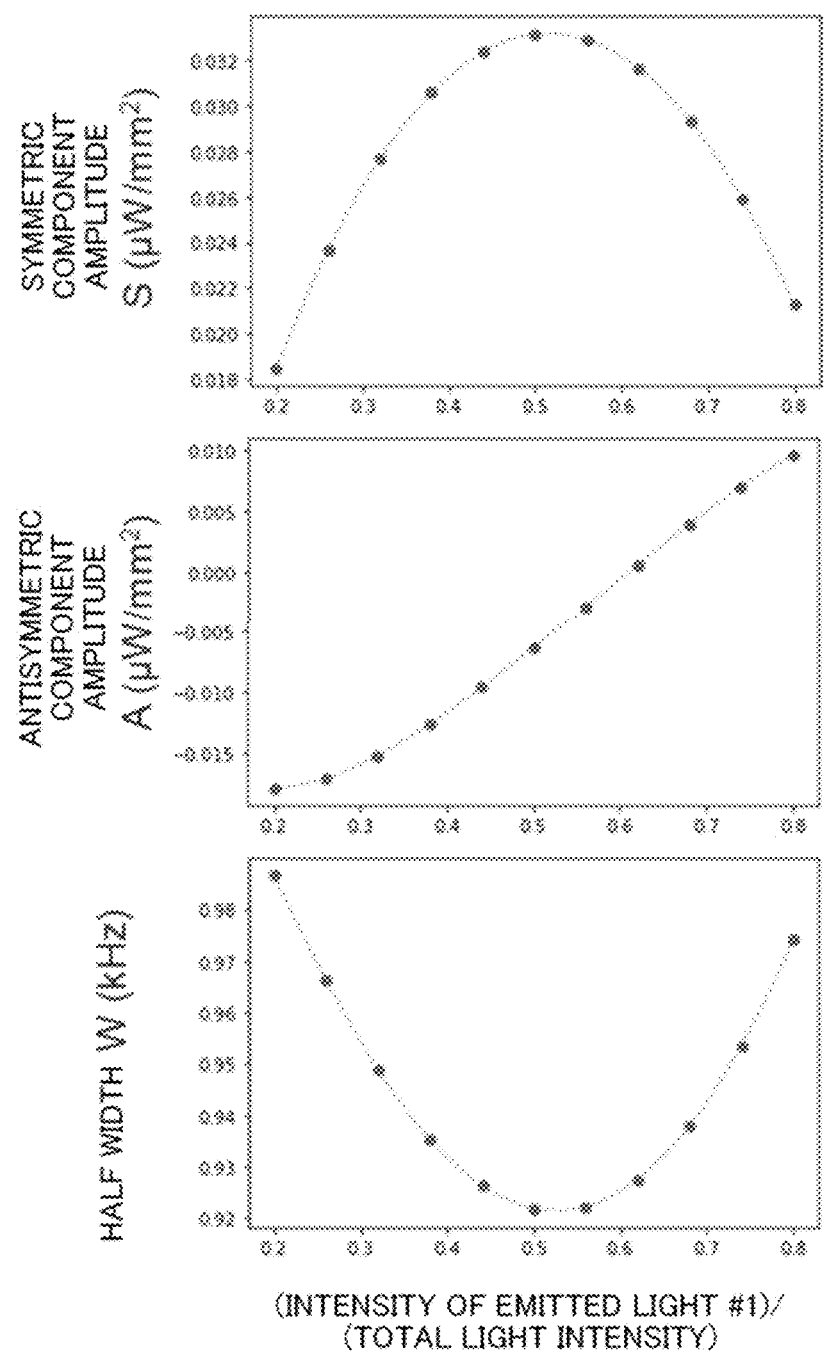
FIG. 9 is a view showing a feature value extracted from a transmitted light spectrum when the strength of light to be emitted varies for each frequency component.

As an example, FIG. 8 shows a feature value extracted from a transmitted light spectrum in a case where the wavelength of emitted light varies under a condition that the intensity of the emitted light is equal for each frequency component. Moreover, FIG. 9 shows a feature value extracted from a transmitted light spectrum in a case where the intensity of emitted light varies for each frequency component under a condition that the wavelength of the emitted light is 0.2 GHz detuned from the excited state. Since the feature value varies with the state of the emitted light, the state of the emitted light can be estimated based on the feature value. If the state of the emitted light is estimated, it is possible to stabilize the oscillation frequency by estimating a frequency shift amount from the state of the light and correcting the frequency shift amount. Alternatively, it is possible to stabilize the oscillation frequency by estimating the state of the emitted light and adjusting a control signal of a light source so that frequency shift is a predetermined value.

Details of First Example Embodiment

This example embodiment will be described below with reference to the drawings. For the purpose of clarification of the explanation, the following descriptions and drawings are omitted and simplified as appropriate. Moreover, in the drawings, the same elements are denoted by the same reference numerals, and duplicate descriptions are omitted as necessary.

[Configuration]

Figure 10:
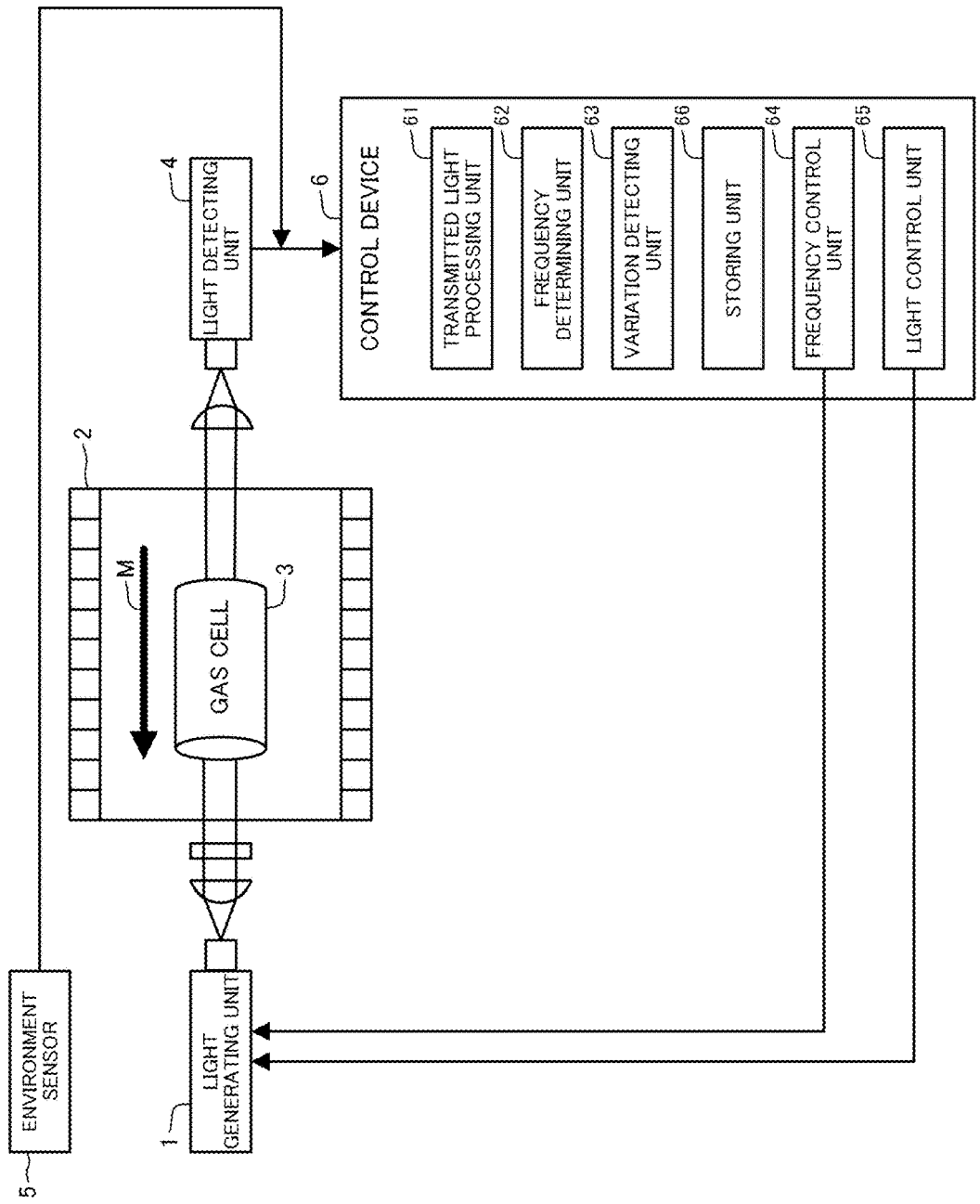
FIG. 10 is a block diagram showing a configuration of an atomic oscillator in a first example embodiment.

FIG. 10 is a functional block diagram of an atomic oscillator according to the first example embodiment. The atomic oscillator according to this example embodiment includes a light generating unit 1, a magnetic field application device 2, a gas cell 3 in which alkali metal atoms or the like are encapsulated in a gaseous state, a light detecting unit 4, an environment sensor 5, and a control device 6. The control device 6 is configured with an information processing device including an arithmetic logic unit and a memory unit. Then, as shown in FIG. 10, the control device 6 includes a transmitted light processing unit 61, a frequency determining unit 62, a variation detecting unit 63, a frequency control unit 64, and a light control unit 65 that ae constructed by execution of a program by the arithmetic logic unit. The control device 6 also includes a storing unit 66 that stores correspondence information to be described later in the memory unit. Hereinafter, the respective components will be described in detail.

The light generating unit 1 generates light having at least two different frequencies. Emitted light that is light generated by the light generating unit 1 is emitted onto the gas cell 3, and transmitted light that is light passed through the gas cell 3 reaches the light detecting unit 4 and is detected, converted into an electric signal or the like, and sent to the control device 6. The light generating unit 1 is also configured so that the wavelength of light to be generated, the intensity of light for each frequency component, and the difference frequency are controlled based on a control signal by the control device 6 as will be described later.

Emitted light that is light generated by the light generating unit 1 has at least two different frequency components. Light emitted by the light generating unit 1 may have three or more different frequency components, and the difference frequency of two frequency components of them is substantially equal to the transition frequency between specific quantum states forming the CPT resonance of the alkali metal atoms. For example, light generated by the light generating unit 1 is realized by generating sidebands by modulating single-wavelength light oscillated from a semiconductor laser or the like at a frequency substantially equal to or half the transition frequency of the alkali metal atoms. At this time, the control of the difference frequency is realized by a mechanism that controls the modulation frequency. Alternatively, light generated by the light generating unit 1 is realized by, for example, combining two single-wavelength lights oscillated from two semiconductor lasers or the like having a mechanism for controlling the difference frequency.

The magnetic field application device 2 generates a magnetic field M in a direction parallel to or antiparallel to the emitted light at a predetermined position inside the gas cell 3. The magnetic field application device 2 is, for example, a coil arranged to cover the gas cell 3 and, by adjusting the direction and magnitude of electric current applied to the coil, the control of the direction and strength of a static magnetic field applied to the predetermined position inside the gas cell 3 is realized.

In the gas cell 3, alkali metal atoms are encapsulated. The alkali metal atoms encapsulated in the gas cell 3 may be cesium atoms, rubidium atoms, sodium atoms, or potassium atoms, for example. The material forming the container of the gas cell 3 is preferably a transparent material such as glass having a large transmittance of the emitted light generated by the light generating unit 1. In the gas cell 3, in addition to the alkali metal atoms, a buffer gas that does not contribute to the absorption of the emitted light may be encapsulated for the purpose of reducing the influence of collision between the container wall surface and the gaseous alkali metal atoms. Moreover, the gas cell 3 may include a temperature control device that does not block the optical path of the emitted light for the purpose of controlling the saturated vapor pressure of the gaseous alkali metal atoms. For example, the temperature control device is configured with a resistance heater.

The light detecting unit 4 has a device that detects transmitted light that is light passed through the gas cell 3. For example, the light detecting unit 4 is realized by using an optical diode, and can be realized by a photodetector serving as a means of detecting light. The information of the light detected by the light detecting unit 4 is converted into an electric signal or the like, and input into the control device 6.

The environment sensor 5 measures a physical quantity to be environmental information at a predetermined position. The physical quantity to be environmental information is, for example, temperature and magnetic field. The measurement position of the environment sensor 5 is desirably a position where the variation of the environmental information in the light generating unit 1 can be detected. As an example, the measurement position of the environment sensor 5 is a position close to the semiconductor laser or the like composing the light generating unit 1. The measurement values of the environmental information obtained by the environment sensor 5 are input into the control device 6.

Next, the transmitted light processing unit 61, the frequency determining unit 62, the variation detecting unit 63, the frequency control unit 64, the light control unit 65, and the storing unit 66 that are included by the control device 6 will be described.

The transmitted light processing unit 61 processes the light amount of transmitted light detected by the light detecting unit 4.

The frequency determining unit 62 determines the difference frequency of light generated by the light generating unit 1 based on the transmitted light amount input from the light detecting unit 4. Specifically, in a case where the difference frequency of light generated by the light generating unit 1 is swept, the frequency determining unit 62 acquires a transmitted light spectrum based on the transmitted light amount input from the light detecting unit 4 and determines a resonance frequency, and moreover performs extraction of the feature value of the transmitted light spectrum necessary for estimating the state of the light generated by the light generating unit 1. That is to say, the frequency determining unit 62 extracts, from a transmitted light spectrum that associates the difference frequency of the emitted light with the light amount of the transmitted light, a feature value representing a previously set feature of the transmitted light spectrum.

The variation detecting unit 63 monitors the variation of the environmental information input from the environment sensor 5. Then, in a case where the variation of the environmental information within a predetermined time is equal to or more than a previously set threshold value, the variation detecting unit 63 regards it as the occurrence of the variation of the environment, enables a previously set determination, and starts a process of estimation of the state of the emitted light by the light control unit 65 to be described later. Moreover, as an example, for the purpose of preventing a change with time of the state of the emitted light, the variation detecting unit 63 also enables the abovementioned determination and starts the state estimation process by the light control unit 65 in a case where a state that the environmental variation is not detected continues for a predetermined period of time.

The frequency control unit 64 generates a control signal that controls the difference frequency of the light generated by the light generating unit 1 based on the output of the frequency determining unit 62. In particular, the frequency control unit 64 controls a modulation frequency input into the light generating unit 1 based on the resonance frequency determined by the frequency determining unit 62. For example, in a case where the light generating unit 1 is composed of a semiconductor laser, the frequency control unit 64 controls the modulation frequency of the drive current of the semiconductor laser.

The storing unit 66 stores a table (correspondence information) representing the correspondence between the state of the excited light and the feature value of the transmitted light spectrum. The feature value of the transmitted light spectrum is obtained by numerically calculating the transmitted light spectrum in advance based on information of the alkali metal atoms and the buffer gas encapsulated in the gas cell 3.

The light control unit 65 performs the state estimation process of estimating the state of the emitted light by using the feature value of the transmitted light spectrum extracted by the frequency determining unit 62. Specifically, the light control unit 65 compares the feature value on the table stored in the storing unit 66 with the feature value extracted by the frequency determining unit 62, and estimates the state of the emitted light associated with the matching feature value on the table as the state of the emitted light that is the light generated by the light generating unit 1. The light control unit 65 also performs the state estimation process on the emitted light in a case where the variation detecting unit 63 enables the determination as described above.

Then, the light control unit 65 controls the emission state of the emitted light based on the estimated state of the emitted light. For example, in a case where the estimated state of the emitted light is the wavelength and intensity of the emitted light, the light control unit 65 generates a control signal that controls to correct the set values of the wavelength and intensity of the emitted light generated by the light generating unit 1. At this time, the light control unit 65 determines whether or not the estimated state of the emitted light is within an allowable range and, when the state of the emitted light is not within the allowable range, corrects the set values of the wavelength and intensity of the emitted light so that the state of the emitted light falls within the allowable range. As an example, in a case where the allowable range is a range in which a transmitted light spectrum with high Q factor and suppressed asymmetric component is realized, the light control unit 65 corrects the set values of the wavelength and intensity of the emitted light so that a transmitted light spectrum with high Q factor and symmetry of the emitted light is realized. Consequently, the emission state of the emitted light is controlled so that the amount of shift in the resonance frequency due to variation in the state of the emitted light is corrected.

The control device 6 has, as a basic function, a function of performing control of the oscillation frequency performed by a general atomic oscillator. For example, a general atomic oscillator includes a VCXO (voltage controlled crystal oscillator) that oscillates at about 10 MHz as a component equivalent to the frequency control unit 64 described above, and the "oscillation frequency" that is the output to the outside of the atomic oscillator is generated from the oscillation signal of this VCXO. At this time, the difference frequency of the emitted light is generated by converting the oscillation signal of the VCXO into a signal of several GHz by a frequency conversion circuit. Then, when the atomic oscillator is started, the control device 6 sweeps the difference frequency by sweeping the conversion factor of the frequency conversion circuit, and determines a resonance frequency fr from the transmitted light spectrum. Once determining the resonance frequency fr, the control device 6 fixes the conversion factor of the frequency conversion circuit to fr/[10 MHz], and adjusts the control voltage of the VCXO so that the locked-in detected error signal of the transmitted light spectrum to a predetermined signal level. At this time, as long as fr does not change, the oscillation signal of the VCXO is stabilized to 10 MHz.

[Operation]

Figure 11:
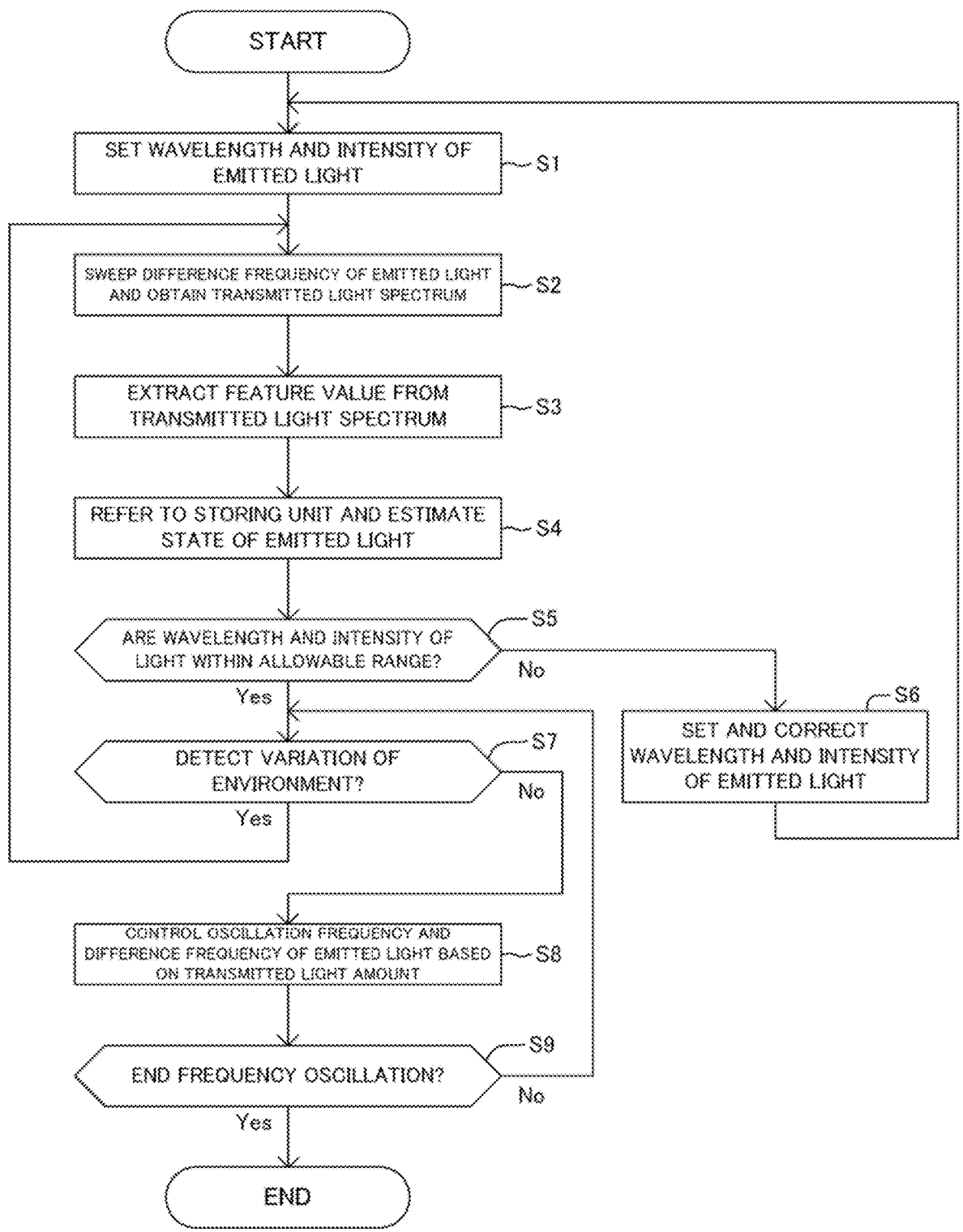
FIG. 11 is a flowchart showing a control method executed by the atomic oscillator in the first example embodiment.

FIG. 11 is a flowchart of the atomic oscillator according to the first example embodiment. The flowchart of FIG. 11 shows a control method executed by the atomic oscillator according to the first example embodiment. The operation in this example embodiment will be described along the flowchart of FIG. 11.

First, the light control unit 65 sets and controls the wavelength and intensity of light generated by the light generating unit 1, and stabilizes them (step S1). The set values of the wavelength and intensity of the light may be, for example, wavelength and intensity at which a transmitted light spectrum due to a CPT resonance is expected to have a high Q factor and a symmetrical shape.

Subsequently, the difference frequency of the light generated by the light generating unit 1 is swept in a predetermined range set by the frequency control unit 64, and the frequency determining unit 62 acquires a transmitted light spectrum in the transmitted light processing unit (step S2). The frequency sweep range shall be a range sufficiently wide with respect to the line width of a transmitted light spectrum expected from the wavelength and intensity of the emitted light.

Subsequently, the frequency determining unit 62 extracts a feature value necessary for estimation of the state of the light from the acquired transmitted light spectrum (step S3). Then, the light control unit 65 estimates the state of the emitted light with reference to a table stored in the storing unit 66 (step S4). As the state of the emitted light, for example, the intensity of the total emitted light, the polarization state of the emitted light, the wavelength of the emitted light before frequency modulation, the intensity of the emitted light for each frequency component, and the like, are estimated. For example, as the polarization state of the emitted light, states such as linear polarization, circular polarization, and intermediate elliptical polarization can be estimated from the transmitted light spectrum.

Subsequently, the light control unit 65 determines whether or not the estimated state of the emitted light is within an allowable range (step S5). As an example, the allowable range shall be a range in which a transmitted light spectrum with high Q factor and suppressed asymmetric component is realized. In a case where the state of the emitted light is not within the allowable range (No at step S5), the light control unit 65 adjust the output to correct the set values of the wavelength and intensity of the emitted light so that a symmetrical transmitted light spectrum having high Q factor is realized as the state of the emitted light (step S6), and the process shifts to step S1.

In a case where the state of the emitted light is within the allowable range (Yes at step S5), the variation detecting unit 63 determines whether or not an environmental variation is detected (step S7). When an environmental variation is detected (Yes at step S7), the process shifts to step S2, where calibration of the state of the light is performed, because the state of the emitted light may have changed significantly. That is to say, when an environmental variation is detected, the abovementioned processes to extract the feature value from the detected transmitted light spectrum, estimate the state of the emitted light, and control the state of the emitted light as necessary are performed (steps S2 to S6). When an environmental variation is not detected (No at step S7), oscillation frequency control based on the transmitted light amount is started (step S8). Then, the above is continued until the frequency oscillation is ended, but when an environmental variation is detected during the control of the oscillation frequency (No at step S9, Yes at step S7), the process shifts to step S2.

Thus, with the atomic oscillator according to the first example embodiment, an atomic oscillator can be realized that estimates and adjusts the state of light emitted onto an atom gas by the abovementioned method and thereby suppresses frequency stability decrease resulting from a variation of the state of the light emitted onto the atomic gas due to a variation of the environment.

Second Example Embodiment

Next, a second example embodiment will be described with reference to the drawings. For the purpose of clarification of explanation, the following descriptions and drawings are omitted and simplified as necessary. Moreover, in the respective drawings, the same elements are denoted by the same reference numerals, and duplicate explanation is omitted as necessary.

[Configuration]

Figure 12:
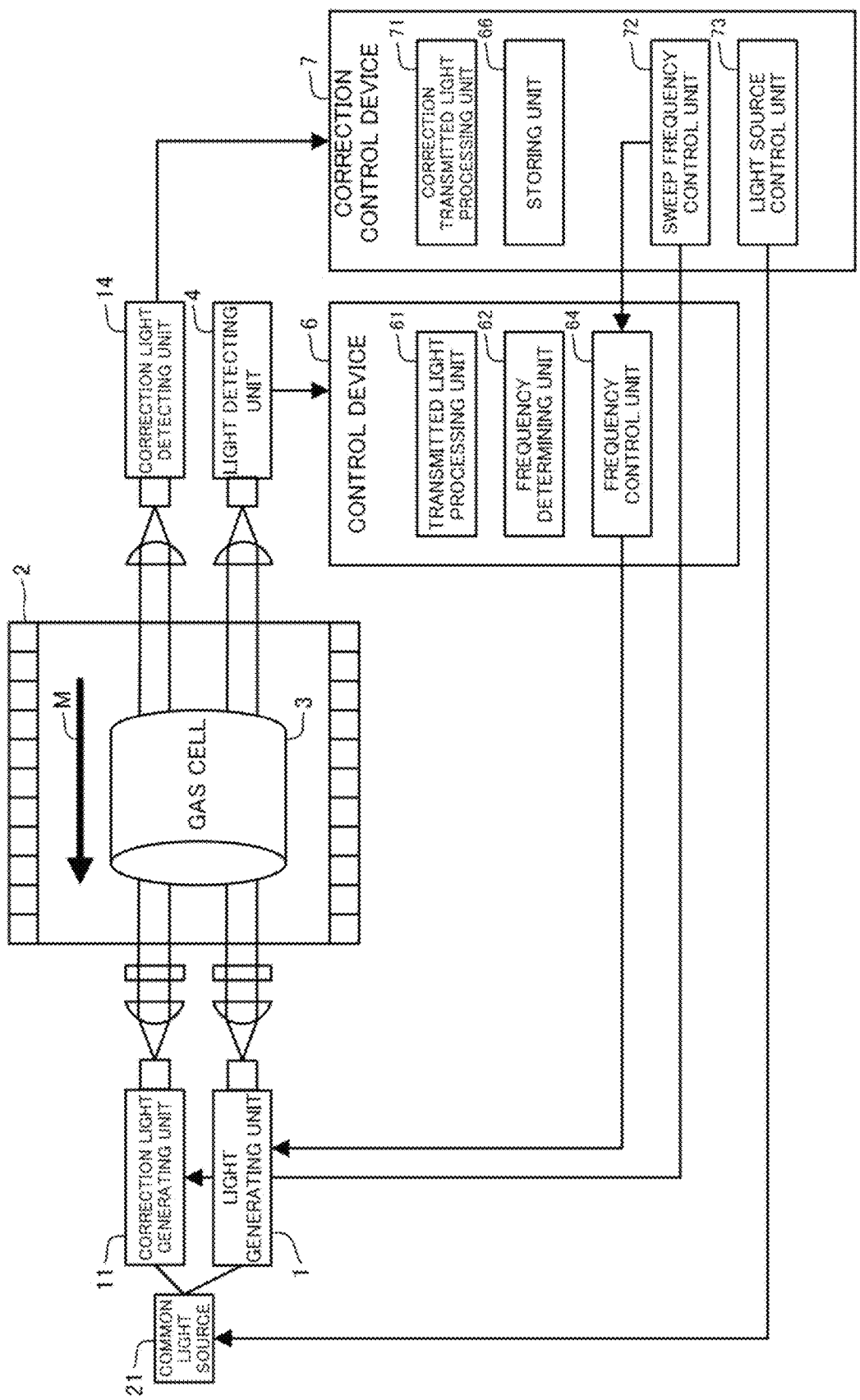
FIG. 12 is a block diagram showing a configuration of an atomic oscillator in a second example embodiment.

FIG. 12 is a block diagram of an atomic oscillator according to a second example embodiment. The atomic oscillator according to this example embodiment includes a common light source 21, a light generating unit 1 and a correction light generating unit 11, a magnetic field application device 2, a gas cell 3 in which alkali metal atoms or the like are encapsulated in a gaseous state, a light detecting unit 4 and a correction light detecting unit 14, and a control device 6 and a correction control device 7.

The control device 6 and the correction control device 7 are each configured with an information processing device including an arithmetic logic unit and a memory unit. The control device 6 includes, as shown in FIG. 12, a transmitted light processing unit 61, a frequency determining unit 62, and a frequency control unit 64 that are constructed by execution of a program by the arithmetic logic unit. The correction control device 7 includes, as shown in FIG. 12, a correction transmitted light processing unit 71, a sweep frequency control unit 72, and a light source control unit 73 that are constructed by execution of a program by the arithmetic logic unit. The correction control device 7 also includes, in the memory unit, a storing unit 66 that stores the abovementioned correspondence information. The respective components will be described in detail below.

The common light source 21 is composed of, for example, a semiconductor laser or the like, and generates single-wavelength light. For example, the common light source 21 can set the wavelength and intensity of generated light by adjusting a drive current and so forth. The generated light is branched through a beam splitter or the like, and is input into the light generating unit 1 and the correction light generating unit 11.

The light generating unit 1 (first light generating unit) and the correction light generating unit 11 (second light generating unit) are each composed of, for example, an acousto-optic device or the like, which performs frequency modulation of the light generated by the common light source 21 and generates light having at least two different frequency components. In particular, the correction light generating unit 11 can sweep a modulation frequency in the frequency modulation based on the input of the sweep frequency control unit 72. The light generating unit 1 and the correction light generating unit 11 can control the intensity for each frequency component of the generated light by adjustment of the modulation strength and the modulation frequency in the frequency modulation by the frequency control unit 64 and the sweep frequency control unit 72.

In the gas cell 3, alkali metal atoms are encapsulated. In the gas cell 3, in addition to the alkali metal atoms, a buffer gas that does not contribute to the absorption of the emitted light may be encapsulated for the purpose of reducing the influence of collision of the gaseous alkali metal atoms with the container wall surface. The gas cell 3 is installed on the optical paths of the light generated by the light generating unit 1 and the light generated by the correction light generating unit 11. That is to say, the light generated by the light generating unit 1 (first emitted light) and the light generated by the correction light generating unit 11 (second emitted light) are emitted onto predetermined positions inside the gas cell 3, respectively. The gas cell 3 may be a single gas cell, or may be composed of two gas cells each of which the same gas at the same pressure is encapsulated in and the same magnetic field is applied to by the magnetic field application device, and the gas cells may be installed on the optical paths of the two emitted lights, respectively.

The light detecting unit 4 has a device detecting transmitted light that is light generated by the light generating unit 1 and passed through the gas cell 3 (first transmitted light). The correction light generating unit 11 has a device detecting correction transmitted light that is light generated by the correction light generating unit 11 and passed through the gas cell 3 (second transmitted light). For example, the light detecting unit 4 and the correction light detecting unit 14 are each realized by using optical diodes. The information of the transmitted light detected by the light detecting unit 4 is converted into an electric signal or the like and input into the control device 6. The information of the transmitted light detected by the correction light detecting unit 14 is converted into an electric signal or the like and input into the correction control device 7.

The control device 6 includes the transmitted light processing unit 61 that processes the transmitted light amount acquired by the light detecting unit 4, the frequency determining unit 62, and the frequency control unit 64 as described above. The correction control device 7 includes the correction transmitted light processing unit 71 that processes the correction transmitted light amount acquired by the correction light detecting unit 14 and acquires a correction transmitted light spectrum, the storing unit 66 that stores a table (correspondence information) representing the correspondence between the state of the emitted light and a feature value extracted from the transmitted light spectrum, the sweep frequency control unit 72, and the light source control unit 73 as described above.

The transmitted light processing unit 61 processes the transmitted light amount acquired by the light detecting unit 4, and the frequency determining unit 62 determines a resonance frequency. The frequency control unit 64 controls a modulation frequency input into the light generating unit 1 based on the resonance frequency determined by the frequency determining unit 62. Moreover, the frequency control unit 64 controls frequency modulation strength based on an input from the sweep frequency control unit 72.

The correction transmitted light processing unit 71 processes the transmitted light amount acquired by the correction light detecting unit 14 together with a modulation frequency swept by the correction light generating unit 11, and acquires a correction transmitted light spectrum (second transmitted light spectrum). Moreover, the correction transmitted light processing unit 71 extracts a feature value necessary for estimating the state of the emitted light from the correction transmitted light spectrum.

The sweep frequency control unit 72 controls the modulation frequency swept by the correction light generating unit 11 and the frequency modulation strength.

The light source control unit 73 performs a state estimation process to estimate the state of the light emitted onto the gas cell 3 by comparing the feature value on the table stored in the storing unit 66 with the feature value extracted by the correction transmitted light processing unit 71. When there is a need to readjust the intensity for each frequency component of the emitted light as a result of the state estimation process, the light source control unit 73 readjusts the frequency modulation strength. The light source control unit 73 adjusts the drive current or the like of the semiconductor laser and controls the wavelength and intensity of the light generated by the common light source 21. Moreover, when there is a need to readjust the wavelength and intensity of the emitted light as a result of the state estimation process, the light source control unit 73 readjusts the output of the light source control unit 73.

[Configuration]

Figure 13:
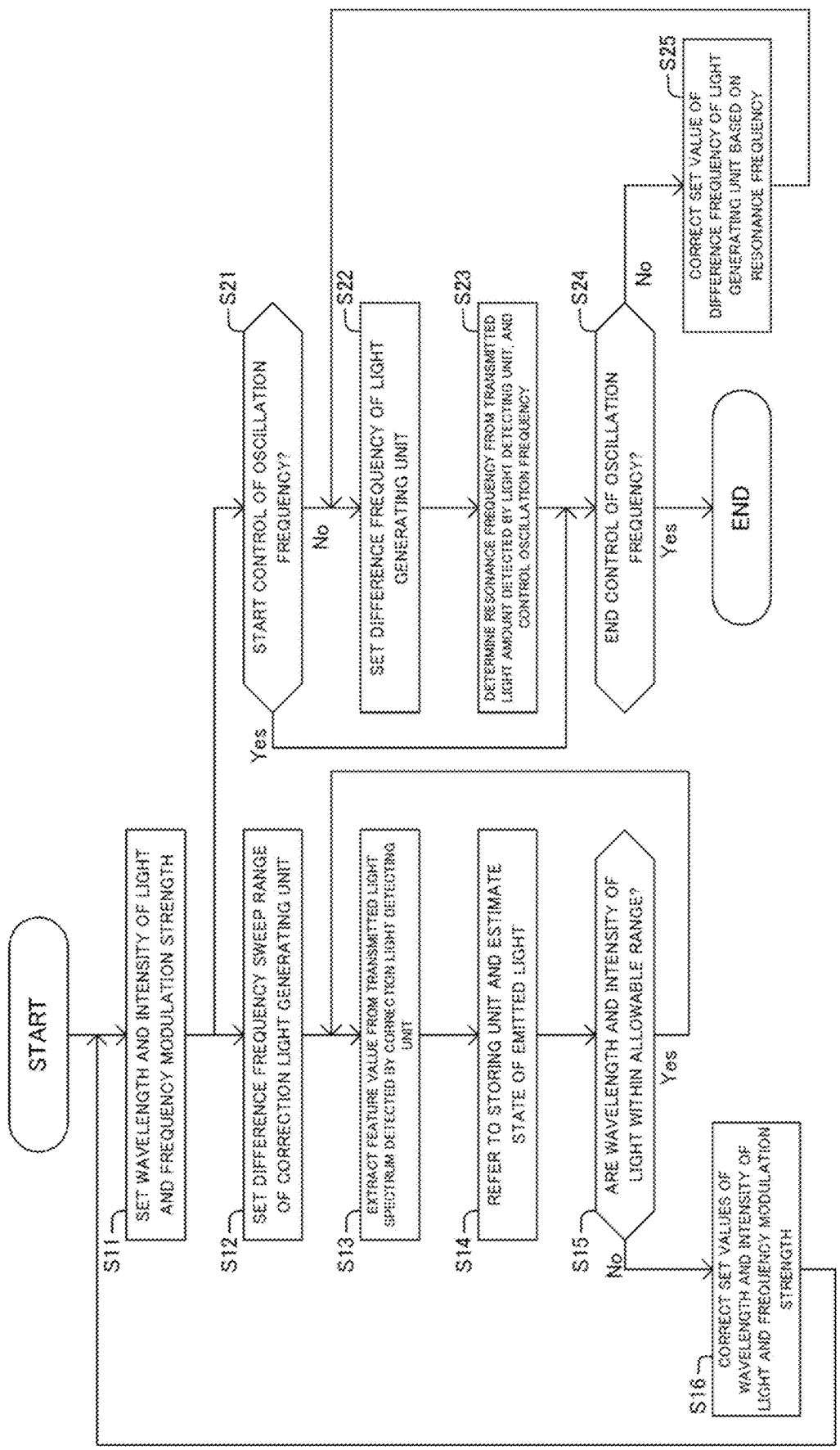
FIG. 13 is a flowchart showing a control method executed by the atomic oscillator in the second example embodiment.

FIG. 13 is a flowchart of the atomic oscillator according to the second example embodiment. The flowchart of FIG. 13 shows a control method executed by the atomic oscillator according to the second example embodiment. The operation in this example embodiment will be described along the flowchart of FIG. 13.

First, the initial setting of the emitted light is performed (step S11). At this time, the wavelength and intensity of light generated by the common light source 21 are set as the output of the light source control unit 73, and light is generated. Moreover, the frequency modulation strengths of the light generating unit 1 and the correction light generating unit 11 are set as the outputs of the frequency control unit 64 and the sweep frequency control unit 72. Light having a plurality of frequency components is generated by applying frequency modulation to single-frequency light, and the intensity ratio of light for each frequency component is controlled by setting the frequency modulation strength, which is the depth of frequency modulation.

Next, the atomic oscillator starts processing relating to control of oscillation frequency (steps S21 to S25) and correction processing performed for the purpose of keeping the state of emitted light within a predetermined range (steps S12 to S16) in parallel.

Firstly, the processing relating to control of oscillation frequency (steps S21 to S25) will be described. First, it is checked whether control of oscillation frequency has been started (step S21). In a case where control of oscillation frequency has not been started (No at step S21), the difference frequency of the light generating unit 1 is set (step S22). The difference frequency of the light generating unit 1 is set by giving a modulation frequency control value in the output of the frequency control unit 64. Then, part of light generated by the light generating unit 1 is passed through the gas cell 3 and detected as transmitted light by the light detecting unit 4. The transmitted light amount is processed by the transmitted light processing unit 61, and a resonance frequency is determined by the frequency determining unit 62. Then, based on the determined resonance frequency, control of oscillation frequency is performed (step S23). The operation is ended in a case where the control of the oscillation frequency is ended (Yes at step S24). In a case where the control of the oscillation frequency is not ended (No at step S24), the set value of the output of the frequency control unit 64 is corrected based on the resonance frequency determined by the frequency determining unit 62 so that the difference frequency of the emitted light coincides with the resonance frequency (step S25), and the process shifts to step S22.

Subsequently, the correction processing performed for the purpose of keeping the state of the emitted light within a predetermined range (steps S12 to S16) will be described. First, the sweep range of the difference frequency of the correction light generating unit 11 is set (step S12). The difference frequency sweep range of the correction light generating unit 11 is set by the output of the sweep frequency control unit 72. The sweep range of the difference frequency shall be a range sufficiently wide with respect to the line width of a correction transmitted light spectrum expected from the wavelength and intensity of the emitted light. Part of light generated by the correction light generating unit 11 is passed through the gas cell 3 and is detected as correction transmitted light by the correction light detecting unit 14. Then, the correction transmitted light processing unit 71 acquires the correction transmitted light spectrum and extracts a feature value (step S13). Subsequently, with the feature value extracted from the correction transmitted light spectrum, the state of the emitted light is estimated with reference to the table stored in the storing unit 66 (step S14). As the state of the emitted light, for example, the intensity of the total emitted light, the polarization state of the emitted light, the wavelength of the emitted light before frequency modulation, the intensity of the emitted light for each frequency component, and the like, are estimated.

Next, it is determined whether or not the estimated state of the light is within an allowable range (step S15). As an example, the allowable range shall be a range that realizes a correction transmitted light spectrum with high Q factor and suppressed asymmetric component. When the estimated state of the light is within the allowable range (Yes at step S15), the process shifts to step S13. When the estimated state of the light is not within the allowable range (No at step S15), the output value of the light source control unit 73 is corrected, and the set values of the wavelength and intensity of the emitted light are corrected so that a transmitted light spectrum with high Q factor and symmetricity is realized. Moreover, the output values of the sweep frequency control unit 72 and the frequency control unit 64 are corrected, and the set values of the frequency modulation strengths of the light generating unit 1 and the correction light generating unit 11 (step S16). After that, the process shifts to step S11. The abovementioned correction processing (steps S12 to S16) is executed at all times in parallel to the processing relating to control of oscillation frequency (steps S21 to S25).

Thus, with the atomic oscillator according to the second example embodiment, an atomic oscillator can be realized that estimates and adjusts at all times the state of light emitted onto an atomic gas by the abovementioned method and thereby suppresses decrease of frequency stability resulting from a variation of the state of the light emitted onto the atomic gas due to a change with time and so forth.

Third Example Embodiment

Figure 14:
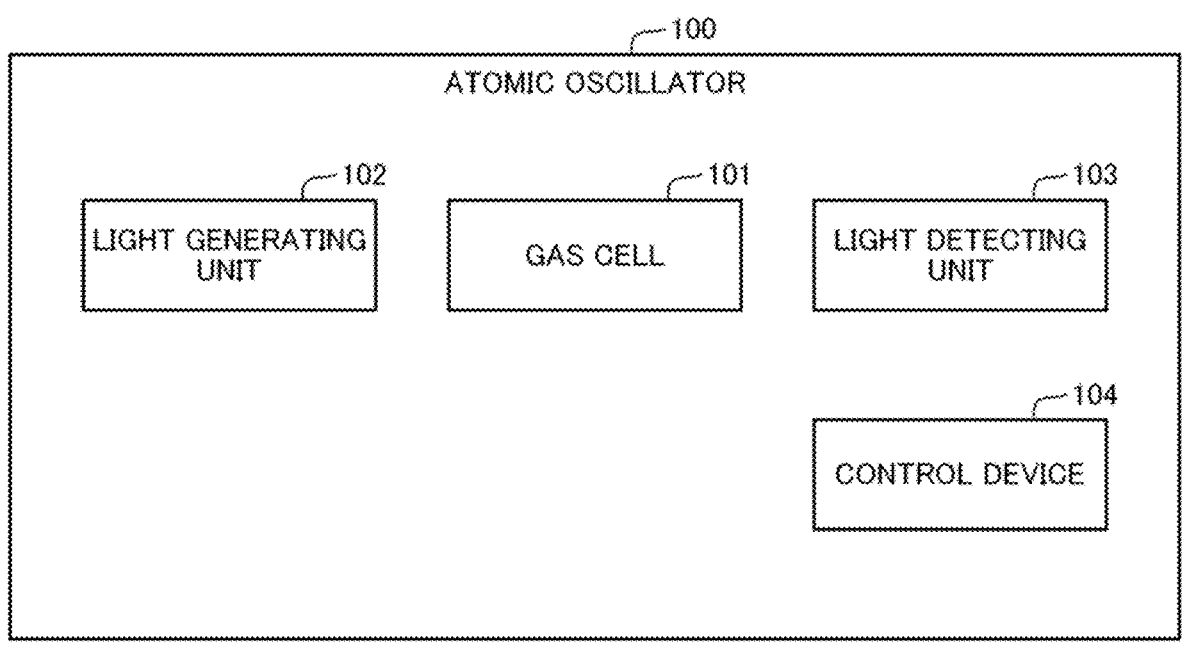
FIG. 14 is a block diagram showing a configuration of an atomic oscillator in a third example embodiment.

Next, a third example embodiment of the present invention will be described with reference to FIG. 14. FIG. 14 is a block diagram showing a configuration of the atomic oscillator in the third example embodiment. In this example embodiment, the overview of the configuration of the atomic oscillator described in the above example embodiments will be shown.

As shown in FIG. 14, an atomic oscillator 100 in this example embodiment includes: a gas cell 101 in which an alkali metal atom is encapsulated; a light generating unit 102 that applies emitted light having at least two different frequency components onto the gas cell; a light detecting unit 103 that detects transmitted light passed through the gas cell; and a control device 104 that determines a resonance frequency of the emitted light based on a light amount of the detected transmitted light. The control device 104 is configured to: store correspondence information in which a preset feature value of a transmitted light spectrum associating a difference frequency of the emitted light with a light amount of the transmitted light is associated with a state of the emitted light; and perform estimation processing to extract a feature value of the transmitted light spectrum from the detected transmitted light and estimate a state of the emitted light corresponding to the extracted feature value of the transmitted light spectrum based on the correspondence information, and control an emission state of the emitted light based on the estimated state of the emitted light.

Thus, the atomic oscillator can suppress decrease of frequency stability resulting from a variation of the state of light emitted onto an atomic gas due to an environmental variation by estimating and adjusting the state of the light emitted on the atomic gas.

Although the present disclosure has been described above with reference to the example embodiments, the present disclosure is not limited to the example embodiments. The configuration of the present disclosure can be changed in various manners that can be understood by one skilled in the art within the scope of the present disclosure.

<Supplementary Notes>

The whole or part of the example embodiments disclosed above can be described as the following supplementary notes. The overview of the configurations of an atomic oscillator and a control method in the present disclosure will be described below. However, the present invention is not limited to the following configurations.

(Supplementary Note 1)

An atomic oscillator comprising:
  a gas cell in which an alkali metal atom is encapsulated;
  a light generating unit that emits emission light having at least two different frequency components onto the gas cell;
  a light detecting unit that detects transmitted light passed through the gas cell; and
  a control device that determines a resonance frequency of the emission light based on a light amount of the detected transmitted light and controls an oscillation frequency, wherein:
  the control device stores correspondence information in which a preset feature value of a transmitted light spectrum associating a difference frequency of the emission light with a light amount of the transmitted light is associated with a state of the emission light; and
  the control device performs estimation processing to extract the feature value of the transmitted light spectrum from the detected transmitted light and estimate the state of the emission light corresponding to the extracted feature value of the transmitted light spectrum based on the correspondence information, and controls an emission state of the emission light based on the estimated state of the emission light.

(Supplementary Note 2)

The atomic oscillator according to Supplementary Note 1, wherein
  the control device controls the emission state of the emission light so as to correct a shift amount of the resonance frequency based on the estimated state of the emission light.

(Supplementary Note 3)

The atomic oscillator according to Supplementary Note 1 or 2, wherein
  the control device controls the emission state of the emission light in a case where the estimated state of the emission light is not within a preset allowable range.

(Supplementary Note 4)

The atomic oscillator according to any of Supplementary Notes 1 to 3, wherein
  the control device estimates at least intensity and wavelength of the emission light as the state of the emission light, and controls at least intensity and wavelength of the emission light based on the estimated state of the emission light.

(Supplementary Note 5)

The atomic oscillator according to any of Supplementary Notes 1 to 4, comprising
  a sensor that measures a preset environment at a position of the light generating unit, wherein
  the control device performs the estimation processing in a case where a variation in the environment measured by the sensor is detected.

(Supplementary Note 6)

The atomic oscillator according to Supplementary Note 5, wherein:
  the sensor measures temperature or magnetic field as the environment; and
  the control device performs the estimation processing in a case where a variation in the temperature or the magnetic field measured by the sensor is equal to or more than a preset threshold value.

(Supplementary Note 7)

The atomic oscillator according to any of Supplementary Notes 1 to 6, comprising:
  a first light generating unit and a second light generating unit as the light generating unit that emit first emission light and second emission light as the emission light, respectively, wherein:
  the light detecting unit detects first transmitted light of the first emission light passed through the gas cell and second transmitted light of the second emission light passed through the gas cell;
  the control device determines the resonance frequency of the first emission light based on a light amount of the detected first transmitted light and controls the oscillation frequency; and
  the control device also performs the estimation processing to extract the feature value of a second transmitted light spectrum as the transmitted light spectrum from the detected second transmitted light and estimate the state of the second emission light corresponding to the extracted feature value of the second transmitted light spectrum based on the correspondence information, and controls the emission state of the first emission light emitted by the first light generating unit based on the estimated state of the second emission light.

(Supplementary Note 8)

A control method by a control device in an atomic oscillator, the atomic oscillator including: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency, the control method comprising:
by the control device, storing correspondence information in which a preset feature value of a transmitted light spectrum associating a difference frequency of the emission light with a light amount of the transmitted light is associated with a state of the emission light; and
by the control device, performing estimation processing to extract the feature value of the transmitted light spectrum from the detected transmitted light and estimate the state of the emission light corresponding to the extracted feature value of the transmitted light spectrum based on the correspondence information, and controlling an emission state of the emission light based on the estimated state of the emission light.

(Supplementary Note 9)

9. A control device in an atomic oscillator, the atomic oscillator including: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency, the control device comprising:
at least one memory configured to store instructions; and
at least one processor configured to execute the instructions to:
store correspondence information in which a preset feature value of a transmitted light spectrum associating a difference frequency of the emission light with a light amount of the transmitted light is associated with a state of the emission light; and
perform estimation processing to extract the feature value of the transmitted light spectrum from the detected transmitted light and estimate the state of the emission light corresponding to the extracted feature value of the transmitted light spectrum based on the correspondence information, and control an emission state of the emission light based on the estimated state of the emission light.

(Supplementary Note 10)

A computer program for a control device in an atomic oscillator, the atomic oscillator including: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency, the computer program comprising instructions for causing the control device to execute processes to:
store correspondence information in which a preset feature value of a transmitted light spectrum associating a difference frequency of the emission light with a light amount of the transmitted light is associated with a state of the emission light; and
perform estimation processing to extract the feature value of the transmitted light spectrum from the detected transmitted light and estimate the state of the emission light corresponding to the extracted feature value of the transmitted light spectrum based on the correspondence information, and control an emission state of the emission light based on the estimated state of the emission light.

DESCRIPTION OF REFERENCE NUMERALS 1 light generating unit
2 magnetic field application device
3 gas cell
4 light detecting unit
5 environment sensor
6 control device
61 transmitted light processing unit
62 frequency determining unit
63 variation detecting unit
64 frequency control unit
65 light control unit
66 storing unit
11 correction light generating unit
14 correction light detecting unit
21 common light source
7 correction control device
71 correction transmitted light processing unit
72 sweep frequency control unit
73 light source control unit
100 atomic oscillator
101 gas cell
102 light generating unit
103 light detection device
104 control device

The invention claimed is:
1. An atomic oscillator comprising:
a gas cell in which an alkali metal atom is encapsulated;
a light generating unit that emits emission light having at least two different frequency components onto the gas cell;
a light detecting unit that detects transmitted light passed through the gas cell; and
a control device that determines a resonance frequency of the emission light based on a light amount of the detected transmitted light and controls an oscillation frequency, wherein:
the control device stores correspondence information in which a preset feature value of a transmitted light spectrum associating a difference frequency of the emission light with a light amount of the transmitted light is associated with a state of the emission light; and
the control device performs estimation processing to extract the feature value of the transmitted light spectrum from the detected transmitted light and estimate the state of the emission light corresponding to the extracted feature value of the transmitted light spectrum based on the correspondence information, and controls an emission state of the emission light based on the estimated state of the emission light.

2. The atomic oscillator according to claim 1, wherein the control device controls the emission state of the emission light so as to correct a shift amount of the resonance frequency based on the estimated state of the emission light.

3. The atomic oscillator according to claim 1, wherein the control device controls the emission state of the emission light in a case where the estimated state of the emission light is not within a preset allowable range.

4. The atomic oscillator according to claim 1, wherein the control device estimates at least intensity and wavelength of the emission light as the state of the emission light, and controls at least intensity and wavelength of the emission light based on the estimated state of the emission light.

5. The atomic oscillator according to claim 1, comprising a sensor that measures a preset environment at a position of the light generating unit, wherein
the control device performs the estimation processing in a case where a variation in the environment measured by the sensor is detected.

6. The atomic oscillator according to claim 5, wherein:
the sensor measures temperature or magnetic field as the environment; and
the control device performs the estimation processing in a case where a variation in the temperature or the magnetic field measured by the sensor is equal to or more than a preset threshold value.

7. The atomic oscillator according to claim 1, comprising:
a first light generating unit and a second light generating unit as the light generating unit that emit first emission light and second emission light as the emission light, respectively, wherein:
the light detecting unit detects first transmitted light of the first emission light passed through the gas cell and second transmitted light of the second emission light passed through the gas cell;
the control device determines the resonance frequency of the first emission light based on a light amount of the detected first transmitted light and controls the oscillation frequency; and
the control device also performs the estimation processing to extract the feature value of a second transmitted light spectrum as the transmitted light spectrum from the detected second transmitted light and estimate the state of the second emission light corresponding to the extracted feature value of the second transmitted light spectrum based on the correspondence information, and controls the emission state of the first emission light emitted by the first light generating unit based on the estimated state of the second emission light.

8. A control method by a control device in an atomic oscillator, the atomic oscillator including: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency,
the control method comprising:
by the control device, storing correspondence information in which a preset feature value of a transmitted light spectrum associating a difference frequency of the emission light with a light amount of the transmitted light is associated with a state of the emission light; and
by the control device, performing estimation processing to extract the feature value of the transmitted light spectrum from the detected transmitted light and estimate the state of the emission light corresponding to the extracted feature value of the transmitted light spectrum based on the correspondence information, and controlling an emission state of the emission light based on the estimated state of the emission light.

9. A control device in an atomic oscillator, the atomic oscillator including: a gas cell in which an alkali metal atom is encapsulated; a light generating unit that emits emission light having at least two different frequency components onto the gas cell; a light detecting unit that detects transmitted light passed through the gas cell; and the control device that determines a resonance frequency of the emission light based on a light amount of the detected transmitted light and controls an oscillation frequency,
the control device comprising:
at least one memory configured to store instructions; and
at least one processor configured to execute the instructions to:
store correspondence information in which a preset feature value of a transmitted light spectrum associating a difference frequency of the emission light with a light amount of the transmitted light is associated with a state of the emission light; and
perform estimation processing to extract the feature value of the transmitted light spectrum from the detected transmitted light and estimate the state of the emission light corresponding to the extracted feature value of the transmitted light spectrum based on the correspondence information, and control an emission state of the emission light based on the estimated state of the emission light.

* * * * *